US010692703B2

(12) United States Patent
Lin et al.

(10) Patent No.: US 10,692,703 B2
(45) Date of Patent: Jun. 23, 2020

(54) CERAMIC HEATER WITH ENHANCED RF POWER DELIVERY

(71) Applicant: Applied Materials, Inc., Santa Clara, CA (US)

(72) Inventors: Xing Lin, San Jose, CA (US); Jianhua Zhou, Campbell, CA (US); Ningli Liu, Cupertino, CA (US); Juan Carlos Rocha-Alvarez, San Carlos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 495 days.

(21) Appl. No.: 15/463,020

(22) Filed: Mar. 20, 2017

(65) Prior Publication Data
US 2017/0278682 A1    Sep. 28, 2017

Related U.S. Application Data

(60) Provisional application No. 62/338,808, filed on May 19, 2016, provisional application No. 62/313,242, filed on Mar. 25, 2016.

(51) Int. Cl.
*H01J 37/32* (2006.01)
*C23C 16/458* (2006.01)
*C23C 16/505* (2006.01)

(52) U.S. Cl.
CPC .... *H01J 37/32724* (2013.01); *C23C 16/4586* (2013.01); *C23C 16/505* (2013.01);
(Continued)

(58) Field of Classification Search
CPC ............... C23C 16/4586; C23C 16/505; H01J 37/32532; H01J 37/32577; H01J 37/32715; H01J 37/32724
(Continued)

(56) References Cited

U.S. PATENT DOCUMENTS 6,189,482 B1 *   2/2001   Zhao ................... C23C 16/4401
                                                          118/715
7,480,981 B2 *   1/2009   Takada ............... G11B 19/2009
                                                           29/596
(Continued)

FOREIGN PATENT DOCUMENTS

JP    2005-063991 A        3/2005
JP    2005063991       *   3/2005
(Continued)

OTHER PUBLICATIONS

PCT Notification of Transmittal of the International Search Report and the Written Opinion of the International Searching Authority for International Application No. PCT/US2017/018573; dated May 29, 2017; 11 total pages.

(Continued)

*Primary Examiner* — Dana Ross
*Assistant Examiner* — Joseph W Iskra
(74) *Attorney, Agent, or Firm* — Patterson + Sheridan LLP

(57) ABSTRACT

Embodiments of the present disclosure generally relate to a substrate support assembly in a semiconductor processing chamber. The semiconductor processing chamber may be a PECVD chamber including a substrate support assembly having a substrate support and a stem coupled to the substrate support. An RF electrode is embedded in the substrate support and a rod is coupled to the RF electrode. The rod is made of titanium (Ti) or of nickel (Ni) coated with gold (Au), silver (Ag), aluminum (Al), or copper (Cu). The rod made of Ti or of Ni coated with Au, Ag, Al or Cu has a reduced electrical resistivity and increased skin depth, which minimizes heat generation as RF current travels through the rod.

15 Claims, 5 Drawing Sheets

(52) U.S. Cl.
CPC .. *H01J 37/32532* (2013.01); *H01J 37/32577* (2013.01); *H01J 37/32715* (2013.01)

(58) Field of Classification Search
USPC ...................................... 219/444.1
See application file for complete search history.

(56) References Cited

U.S. PATENT DOCUMENTS

| | | | |
|---|---|---|---|
| 8,884,524 B2* | 11/2014 | Zhou | H01J 37/32577 |
| | | | 315/111.21 |
| 2005/0028739 A1* | 2/2005 | Natsuhara | C23C 16/4581 |
| | | | 118/728 |
| 2009/0002913 A1 | 1/2009 | Naim | |
| 2009/0321019 A1 | 12/2009 | Chen et al. | |

FOREIGN PATENT DOCUMENTS

| | | |
|---|---|---|
| KR | 10-2014-0097312 A | 8/2014 |
| KR | 2016-0002544 A | 1/2016 |

OTHER PUBLICATIONS

Korean Notification of Reason for Refusal dated Sep. 16, 2019 for Application No. 10-2018-7030799.

* cited by examiner

CERAMIC HEATER WITH ENHANCED RF POWER DELIVERY

CROSS-REFERENCE TO RELATED APPLICATIONS

This application claims priority to U.S. Provisional Patent Application Ser. No. 62/313,242 filed on Mar. 25, 2016, and U.S. Provisional Patent Application Ser. No. 62/338,808, filed on May 19, 2016, which herein are incorporated by reference.

BACKGROUND

Field

Embodiments of the present disclosure generally relate to a semiconductor processing chamber, and more specifically, to a substrate support assembly in a semiconductor processing chamber.

Description of the Related Art

Semiconductor processing involves a number of different chemical and physical processes to create minute integrated circuits on a substrate. Layers of materials which make up the integrated circuit are created by processes including chemical vapor deposition, physical vapor deposition, epitaxial growth, and the like. Some of the layers of material are patterned using photoresist masks and wet or dry etching techniques. The substrates utilized to form integrated circuits may be silicon, gallium arsenide, indium phosphide, glass, or other appropriate materials.

In the manufacture of integrated circuits, plasma processes are often used for depositing or etching of various material layers. Plasma processing offers many advantages over thermal processing. For example, plasma enhanced chemical vapor deposition (PECVD) allows deposition processes to be performed at lower temperatures and at higher deposition rates than achievable in analogous thermal processes. Thus, PECVD is advantageous for integrated circuit fabrication with stringent thermal budgets, such as for very large scale or ultra-large scale integrated circuit (VLSI or ULSI) device fabrication.

The processing chambers used in these processes typically include a substrate support assembly having a substrate support, such as an electrostatic chuck (ESC), disposed therein to secure the substrate during processing. The substrate support assembly may include a radio frequency (RF) electrode embedded in the substrate support and a rod connecting the RF electrode to a reference voltage, such as the ground, for an RF current to travel from the RF electrode to the reference voltage. Conventionally the rod is made of nickel (Ni), which generates heat, leading to hot spots on a top surface of the substrate support, which in turn leads to thickness non-uniformity in layer formed on a substrate disposed on the top surface of the substrate support.

Therefore, there is a need for an improved substrate support assembly.

SUMMARY

In one embodiment, a substrate support assembly includes a substrate support, a stem connected to the substrate support, and a first rod disposed within the stem. The first rod is made of titanium or of nickel coated with gold, silver, aluminum or copper.

In another embodiment, a substrate support assembly includes a substrate support, a stem connected to the substrate support, and a rod disposed with the stem. The rod includes a first portion having a first diameter and a second portion having a second diameter. The second diameter is greater than the first diameter.

In another embodiment, a substrate support assembly includes a substrate support, a stem connected to the substrate support, a radio frequency electrode embedded in the substrate support, and a first rod disposed within the stem. The first rod is connected to the radio frequency electrode. The substrate support assembly further includes a second rod disposed within the stem, and the second rod is connected to the radio frequency electrode. The substrate support assembly further includes a connecting member disposed within the stem. The connecting member is connected to the first rod and the second rod.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a substrate support assembly in a semiconductor processing chamber. The semiconductor processing chamber may be a PECVD chamber including a substrate support assembly having a substrate support and a stem coupled to the substrate support. An RF electrode is embedded in the substrate support and a rod is coupled to the RF electrode. The rod is made of titanium (Ti) or of nickel (Ni) coated with gold (Au), silver (Ag), aluminum (Al), or copper (Cu). The rod made of Ti or of Ni coated with Au, Ag, Al or Cu has a reduced electrical resistivity and increased skin depth, which minimizes heat generation as RF current travels through the rod.

Figure 1:
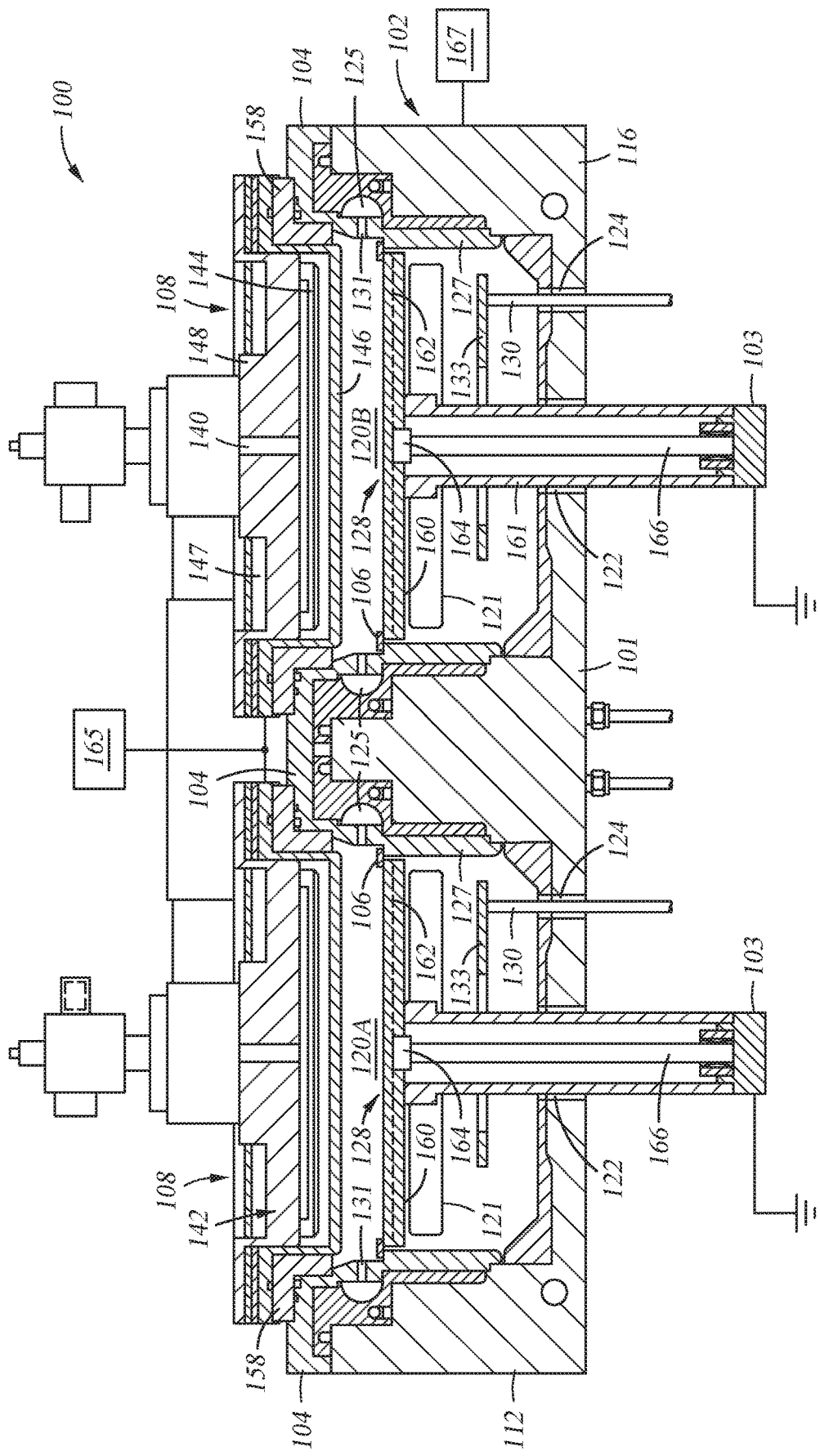
FIG. 1 illustrates a schematic, cross-sectional view of a plasma processing chamber according to one embodiment described herein.

FIG. 1 illustrates a schematic cross-sectional view of a plasma processing chamber 100. The plasma processing chamber 100 generally comprises a processing chamber body 102 having sidewalls 112, a bottom wall 116, and a shared interior sidewall 101 defining a pair of processing regions 120A and 120B. Each of the processing regions 120A, 120B is similarly configured, and for the sake of brevity, only components in the processing region 120B will be described.

A substrate support assembly 128 is disposed in the processing region 120B through a passage 122 formed in the bottom wall 116 in the plasma processing chamber 100. The substrate support assembly 128 includes a substrate support 160 for supporting a substrate (not shown) and a stem 161 coupled to the substrate support 160. The substrate support assembly 128 may also include an RF electrode 162, a stub 164, and a rod 166. The RF electrode 162 and the stub 164 may be embedded in the substrate support 160, and the rod 166 may be disposed within the stem 161. A heating element (not shown), such as a resistive heating element, may be also embedded in the substrate support 160 to heat and control the substrate temperature. The stem 161 couples the substrate support assembly 128 to a power outlet or power box 103. The power box 103 may include a drive system that controls the elevation and movement of the substrate support assembly 128 within the processing region 120B. The power box 103 also includes interfaces for electrical power and temperature indicators, such as a thermocouple interface.

A rod 130 is disposed through a passage 124 formed in the bottom wall 116 of the processing region 120B and is utilized to position substrate lift pins (not shown) through openings (not shown) formed in the substrate support 160. The rod 130 is coupled to a lift plate 133 that contacts the lift pins. The substrate lift pins selectively space the substrate from the substrate support 160 to facilitate exchange of the substrate with a robot (not shown) utilized for transferring the substrate into and out of the processing region 120B through a substrate transfer port 121.

A chamber lid 104 is coupled to a top portion of the chamber body 102. The lid 104 accommodates one or more gas distribution systems 108 coupled thereto. The gas distribution system 108 includes a gas inlet passage 140 which delivers reactant and cleaning gases through a showerhead assembly 142 into the processing region 120B. The showerhead assembly 142 includes a base plate 148 having a blocker plate 144 disposed intermediate to a faceplate 146. An RF source 165 is coupled to the showerhead assembly 142. The RF source 165 powers the showerhead assembly 142 to facilitate generation of a plasma between the faceplate 146 of the showerhead assembly 142 and the substrate support assembly 128. In one embodiment, the RF source 165 may be a high frequency radio frequency (HFRF) power source, such as a 13.56 MHz RF generator. In another embodiment, RF source 165 may include a HFRF power source and a low frequency radio frequency (LFRF) power source, such as a 300 kHz RF generator. Alternatively, the RF source may be coupled to other portions of the processing chamber body 102, such as the substrate support assembly 128, to facilitate plasma generation. A dielectric isolator 158 is disposed between the lid 104 and showerhead assembly 142 to prevent conducting RF power to the lid 104. A shadow ring 106 may be disposed on the periphery of the substrate support 160 that engages the substrate at a predetermined elevation.

Optionally, a cooling channel 147 is formed in the base plate 148 of the gas distribution system 108 to cool the base plate 148 during operation. A heat transfer fluid, such as water, ethylene glycol, a gas, or the like, may be circulated through the cooling channel 147 such that the base plate 148 is maintained at a predefined temperature.

A chamber liner assembly 127 is disposed within the processing region 120B in very close proximity to the sidewalls 101, 112 of the chamber body 102 to prevent exposure of the sidewalls 101, 112 to the processing environment within the processing region 120B. The liner assembly 127 includes a circumferential pumping cavity 125 that is coupled to a pumping system 167 configured to exhaust gases and byproducts from the processing region 120B and control the pressure within the processing region 120B. A plurality of exhaust ports 131 may be formed on the chamber liner assembly 127. The exhaust ports 131 are configured to allow the flow of gases from the processing region 120B to the circumferential pumping cavity 125 in a manner that promotes processing within the plasma processing chamber 100.

The substrate support assembly 128 is not limited to use in CVD/PECVD processing chamber and may be used in PVD and etch semiconductor processing chambers.

Figure 2:
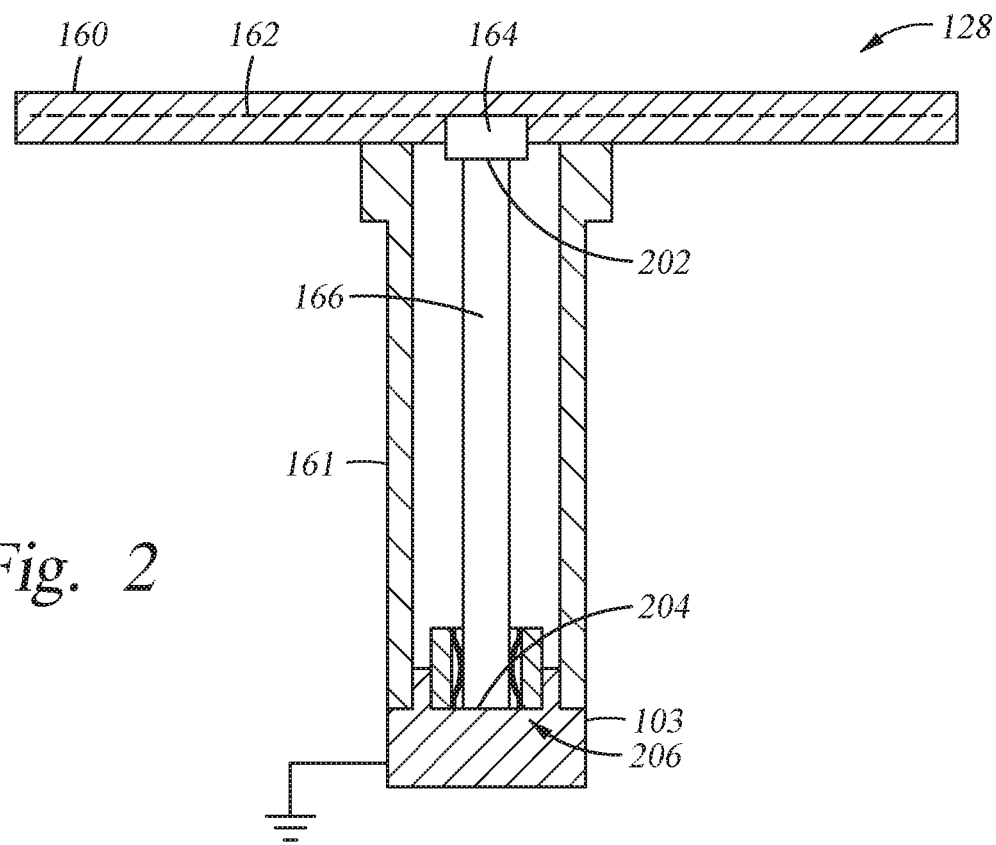
FIG. 2 illustrates a schematic cross-sectional view of a substrate support assembly disposed in the plasma processing chamber of FIG. 1 according to one embodiment described herein.

FIG. 2 illustrates a schematic cross-sectional view of the substrate support assembly 128 disposed in the plasma processing chamber 100 of FIG. 1 according to one embodiment described herein. As shown in FIG. 2, the substrate support assembly 128 includes the substrate support 160, the stem 161, and the rod 166 disposed within the stem 161. The substrate support 160 may be made of aluminum nitride and a heating element (not shown) may be embedded therein. The RF electrode 162 and the stub 164 may be embedded in the substrate support 160, and the RF electrode 162 and the stub 164 may be made of Mo. The rod 166 has a first end 202 and a second end 204 opposite the first end 202. The first end 202 may be connected to the stub 164, and a brazing material may be used to connect the first end 202 of the rod 166 and the stub 164. The brazing material may be a metal alloy, such as Al or Au alloy. Al alloy may be used when the processing temperature is relatively low, such as less than about 350 degrees Celsius. Au alloy may be used when the processing temperature is relatively high, such as between about 350 degrees Celsius and about 700 degrees Celsius or between about 400 degrees Celsius and about 650 degrees Celsius. The rod 166 may be a solid rod or a hollow rod. The rod 166 may be made of Ti, which has low relative permeability compared to Ni. Thus, the skin depth of the rod 166 made of Ti is much higher than that of a rod made of Ni, leading to reduced heat generation in the rod 166 as RF current travels through the rod 166.

Alternatively, the rod 166 may be made of Ni coated with Au, Ag, Al or Cu. The Au, Ag, Al or Cu coating also increases skin depth of the rod 166, leading to reduced heat generation in the rod 166 as RF current travels through the rod 166. For example, Au has a skin depth of about 20 microns at 13.56 Mhz, which is over 10 times greater than the skin depth of Ni. In addition, Au has a low permeability and high electrical conductivity. Thus, resistive heat generated in the rod 166 as the RF current travels through the rod 166 is reduced with Au, Ag, Al or Cu coating. The second end 204 of the rod 166 may be inserted into a contact 206 in the power box 103, and the power box 103 may be connected to a reference voltage, such as the ground, as shown in FIG. 2. The contact 206 may be a compact design allowing a plurality of contacts 206 formed in the power box 103. The contact 206 is shown in FIG. 3.

Figure 3:
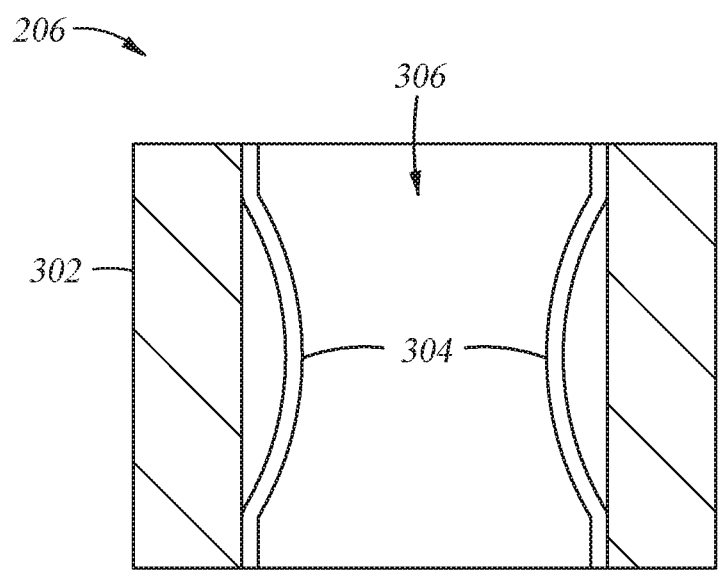
FIG. 3 illustrates a schematic cross-sectional side view of a contact according to one embodiment described herein.

FIG. 3 is a schematic cross-sectional side view of the contact 206 according to one embodiment described herein. As shown in FIG. 3, the contact 206 includes a body 302, an opening 306 and one or more multi-lam strips 304. The body 302 may be made of a conductive metal, such as aluminum, and the body 302 is electrically connected to a reference voltage, such as the ground. The strips 304 may be made of a conductive metal, such as copper, beryllium-copper, or nickel-beryllium, which can withstand elevated temperatures. The contact 206 may be disposed in the power box 103 (FIG. 1), and the second end 204 of the rod 166 (FIG. 2) may be inserted into the opening 306. Each strip 304 may have a convex shape in the opening 306 to ensure good electrically contact with the rod 166. In addition, the strips 304 help compensate for thermal expansion or contraction of the rod 166 during operation.

Figure 4:
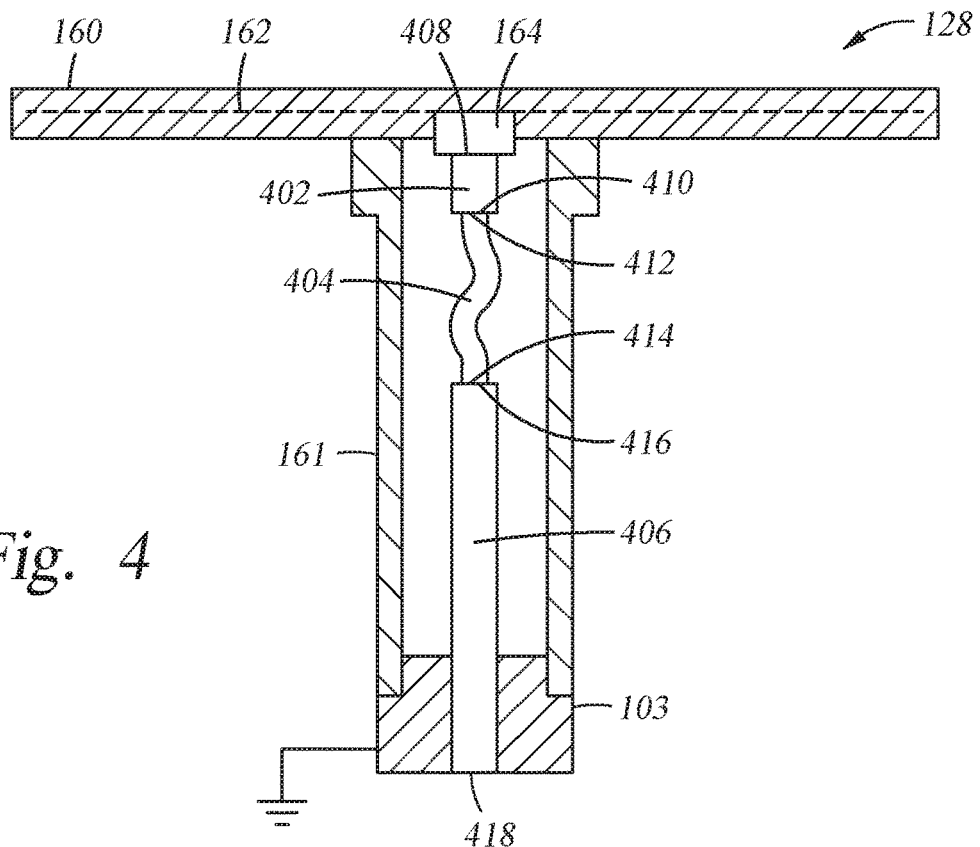
FIG. 4 illustrates a schematic cross-sectional view of a substrate support assembly disposed in the plasma processing chamber of FIG. 1 according to another embodiment described herein.

FIG. 4 illustrates a schematic cross-sectional view of the substrate support assembly 128 disposed in the plasma processing chamber 100 of FIG. 1 according to another embodiment described herein. As shown in FIG. 4, the substrate support assembly 128 includes a first rod 402 connected to the stub 164, a flexible cable 404 connected to the first rod 402, and a second rod 406 connected to the flexible cable 404. The first rod 402, the flexible cable 404, and the second rod 406 are disposed within the stem 161. The flexible cable 404 is flexible in order to compensate for thermal expansion or contraction of the second rod 406 during operation. Because it is difficult to connect the flexible cable 404 to the stub 164 and to maintain a good connection between the flexible cable 404 and the stub 164, the first rod 402 is used. The first rod 402 may be a solid rod or a hollow rod. The first rod 402 may have a relatively short length, such as about one fifth of the length of the second rod 406. The first rod 402 may be made of Ni. The first rod 402 has a first end 408 connected to the stub 164 and a second end 410 connected to the flexible cable 404. A brazing material may be used to connect the first end 408 of the first rod 402 and the stub 164. The brazing material may be a metal alloy, such as Al or Au alloy.

The flexible cable 404 may be made of Ni, and the flexible cable 404 includes a first end 412 and a second end 414. The first end 412 of the flexible cable 404 may be connected to the second end 410 of the first rod 402. The flexible cable 404 is flexible in order to compensate for thermal expansion or contraction of the second rod 406 during operation. The second rod 406 may be a solid rod or a hollow rod. The second rod 406 includes a first end 416 and a second end 418. The first end 416 may be connected to the second end 414 of the flexible cable 404, and the second end 418 may be inserted into the power box 103. The second rod 406 may be made of Ti or of Ni coated with Au, Ag, Al or Cu in order to reduce heat generated in the rod 406 due to increased skin depth. The compact contact (FIG. 3) may be not used since thermal expansion and contraction is compensated by the flexible cable 404.

Figure 5:
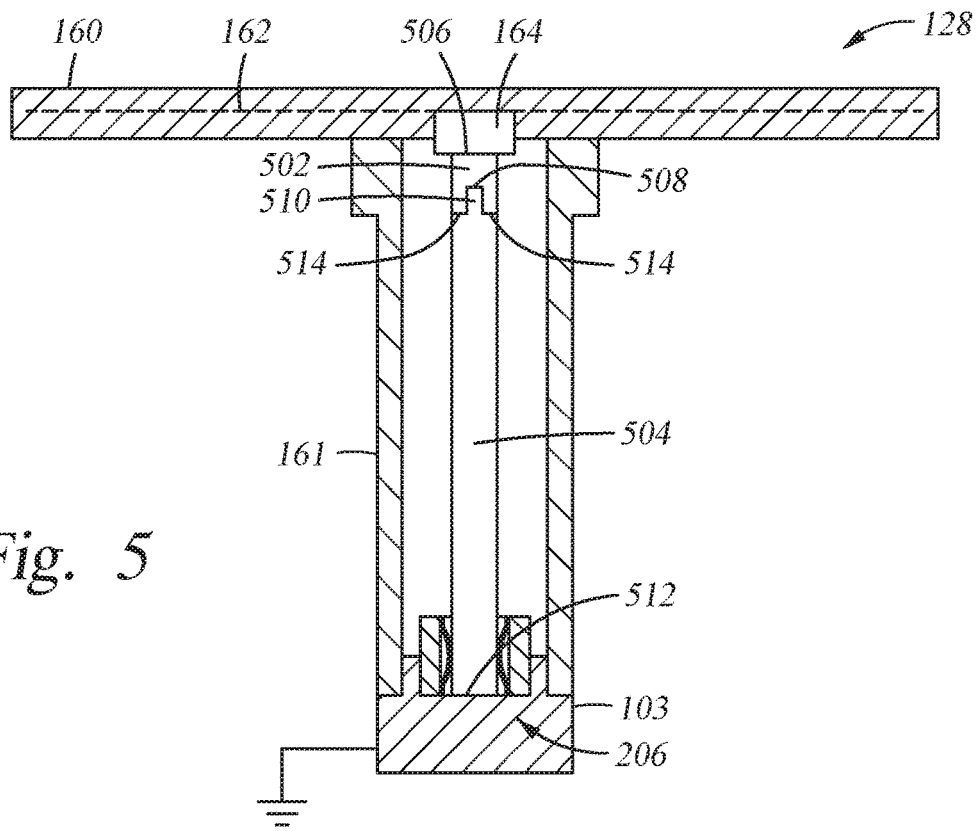
FIG. 5 illustrates a schematic cross-sectional view of a substrate support assembly disposed in the plasma processing chamber of FIG. 1 according to another embodiment described herein.

FIG. 5 illustrates a schematic cross-sectional view of the substrate support assembly 128 disposed in the plasma processing chamber 100 of FIG. 1 according to another embodiment described herein. As shown in FIG. 5, the substrate support assembly 128 includes a first rod 502 and a second rod 504. The first rod 502 and the second rod 504 are disposed within the stem 161. The first rod 502 may be a solid rod or a hollow rod. The first rod 502 may have a relatively short length, such as about one tenth of the length of the second rod 504. The first rod 502 may be made of Ni. The first rod 502 includes a first end 506 connected to the stub 164 and a second end 508 connected to the second rod 504. A brazing material may be used to connect the first end 506 of the first rod 502 and the stub 164. The brazing material may be a metal alloy, such as Al or Au alloy. The second rod 504 may be a solid rod or a hollow rod. The second rod 504 includes a first end 510 and a second end 512. The first end 510 may be connected to the second end 508 of the first rod 502, and the second end 512 may be inserted into the contact 206 in the power box 103. The second rod 504 may be made of Ti or of Ni coated with Au, Ag, Al or Cu in order to reduce heat generated in the rod 504 due to increased skin depth. The contact 206 may be used in order to compensate for thermal expansion and contraction in the second rod 504.

The second end 508 of the first rod 502 and the first end 510 of the second rod 504 may be easily connected. In one embodiment, the first end 510 of the second rod 504 is screwed into the second end 508 of the first rod 502, and the first end 510 of the second rod 504 has shoulder contact portions 514 for connectivity. In some embodiments, the contacting interface between the first rod 502 and the second rod 504 is welded to improve reliability.

Figure 6:
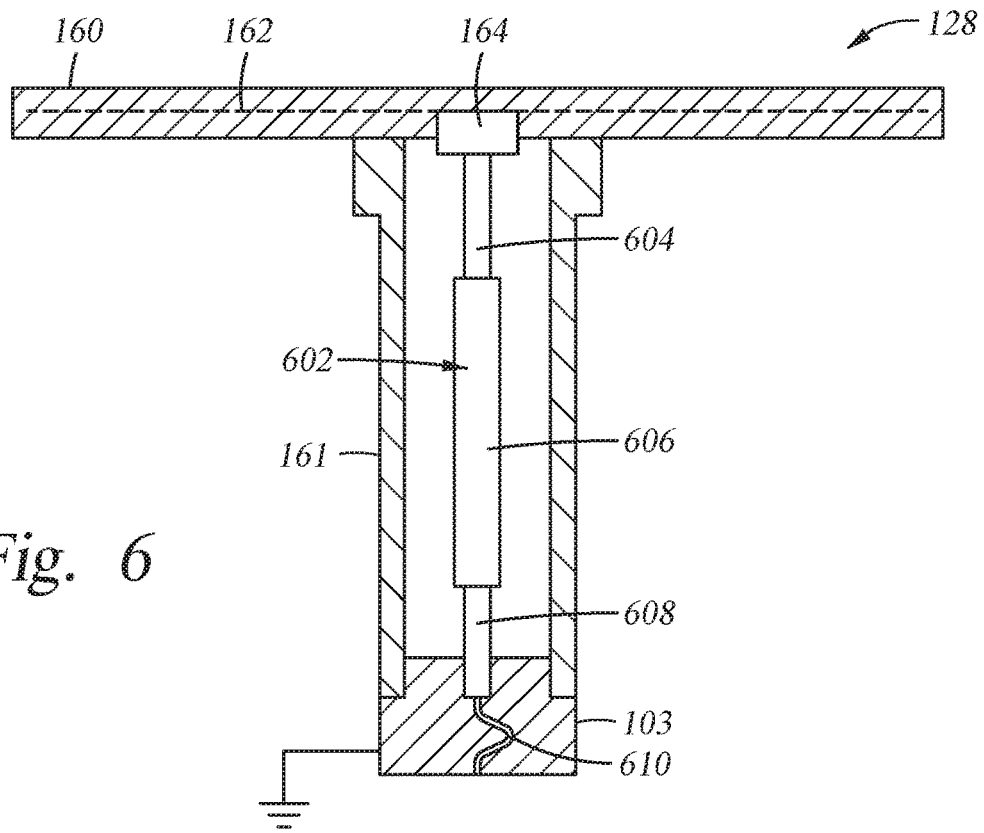
FIG. 6 illustrates a schematic cross-sectional view of a substrate support assembly disposed in the plasma processing chamber of FIG. 1 according to another embodiment described herein.

FIG. 6 illustrates a schematic cross-sectional view of the substrate support assembly 128 disposed in the plasma processing chamber 100 of FIG. 1 according to another embodiment described herein. As shown in FIG. 6, the substrate support assembly 128 includes a rod 602 disposed within the stem 161. The rod 602 may be a solid rod or a hollow rod. The rod 602 may include a first portion 604 having a first diameter and a second portion 606 having a second diameter. The first portion 604 may have a diameter that is one third of the diameter of the second portion 606. With the larger diameter, the cross-section where RF current flow increases since RF current flows through the surface of the rod 602, leading to the rod 602 having reduced resistance. The first portion 604 may have a length that is one sixth of the length of the second portion 606. The rod 602 may be made of Ni, Ti, or of Ni coated with Au, Ag, Al or Cu. The second portion 606 may be in physical contact with the power box 103. In one embodiment, an RF strap 610 is disposed in the power box 103 and the second portion 606 is connected to the RF strap 610. The RF strap 610 is designed to be elastic and flexible enough to compensate for the thermal expansion of the rod 602. The first portion 604 and the second portion 606 may be a single piece of material or two pieces of material that are coupled together, such as welded together.

In some embodiments, the rod 602 may include a third portion 608 between the second portion 606 and the power box 103. The third portion 608 may be connected to the RF strap 610. The third portion 608 may have the same diameter as the first portion 604. The third portion 608 may be made of the same material as the first and second portions 604, 606. The ratio of the lengths of the first, second and third portions 604, 606, 608 may be one to three to two, respectively. The first, second and third portions 604, 606, 608 may be a single piece of material or three pieces of material that are coupled together, such as welded together.

Figure 7:
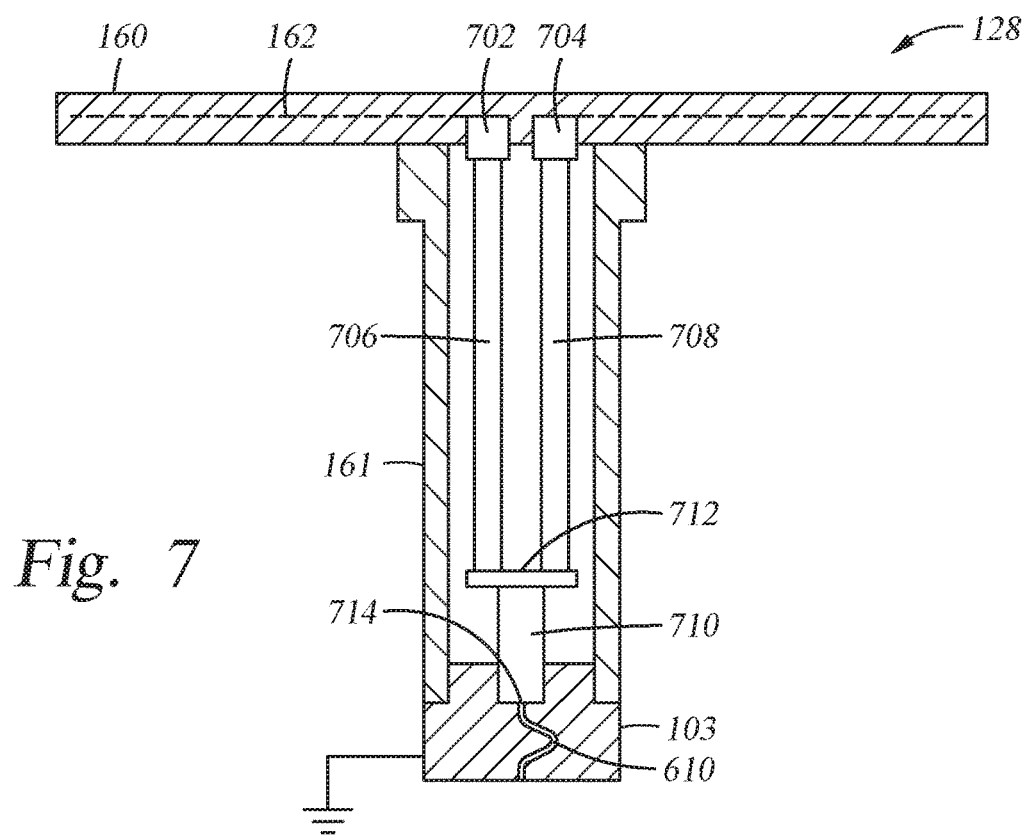
FIG. 7 illustrates a schematic cross-sectional view of a substrate support assembly disposed in the plasma processing chamber of FIG. 1 according to another embodiment described herein.

FIG. 7 illustrates a schematic cross-sectional view of the substrate support assembly 128 disposed in the plasma processing chamber 100 of FIG. 1 according to another embodiment described herein. As shown in FIG. 7, the substrate support assembly 128 includes a first stub 702, a second stub 704, a first rod 706 connected to the first stub 702, a second rod 708 connected to the second stub 704, and a connecting member 710 connected to the first rod 706 and the second rod 708. The first and second stubs 702, 704 may be the same as the stub 164. The first and second rods 706, 708 each may be a solid rod or a hollow rod, and may be made of Ni, Ti, or of Ni coated with Au, Ag, Al or Cu. The first rod 706 or the second rod 708 may be replaced with the rod shown in FIGS. 4, 5 and 6. With more than one rod connecting the RF electrode 162 and the power box 103, RF current splits into multiple paths when traveling from the RF electrode 162 to the power box 103, leading to reduced heat generated in the rods 706, 708. The connecting member 710 has a first end 712 connected to the first and second rods 706, 708 and a second end 714 connected to the RF strap 610 in the power box 103.

Figure 8:
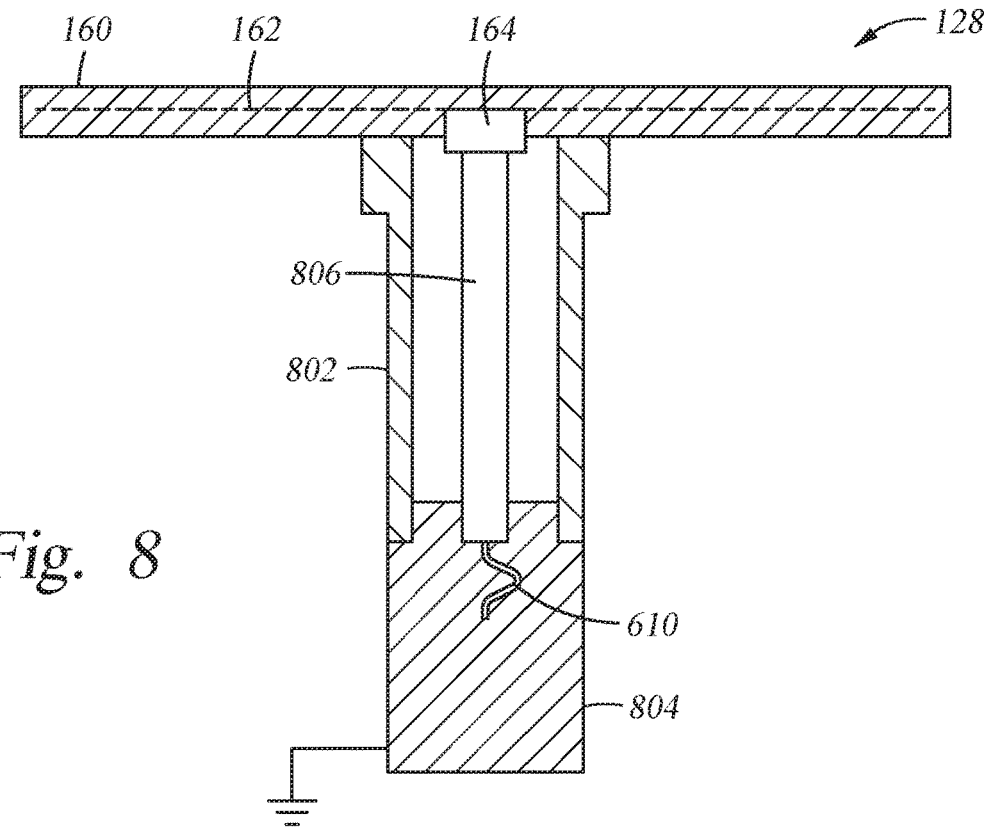
FIG. 8 illustrates a schematic cross-sectional view of a substrate support assembly disposed in the plasma processing chamber of FIG. 1 according to another embodiment described herein.

FIG. 8 illustrates a schematic cross-sectional view of the substrate support assembly 128 disposed in the plasma processing chamber 100 of FIG. 1 according to another embodiment described herein. As shown in FIG. 8, the substrate support assembly 128 includes the substrate support 160, a stem 802, and a rod 806 disposed within the stem 802. The rod 806 may be connected to the RF strap 610 disposed in a power box 804. The power box 804 may have a length longer than a conventional power box. The stem 802 and the rod 806 have a shorter length than conventional stem and rod. Shorter rod 806 helps reduce heat generated in the rod 806 as an RF current travels through the rod 806. The ratio of the lengths of the rod 806 and the power box 804 may be one to one. The rod 806 may be made of Ni, Ti, or of Ni coated with Au, Ag, Al or Cu. The rod shown in FIGS. 4, 5 and 6 may be used as the rod 806.

Figure 9:
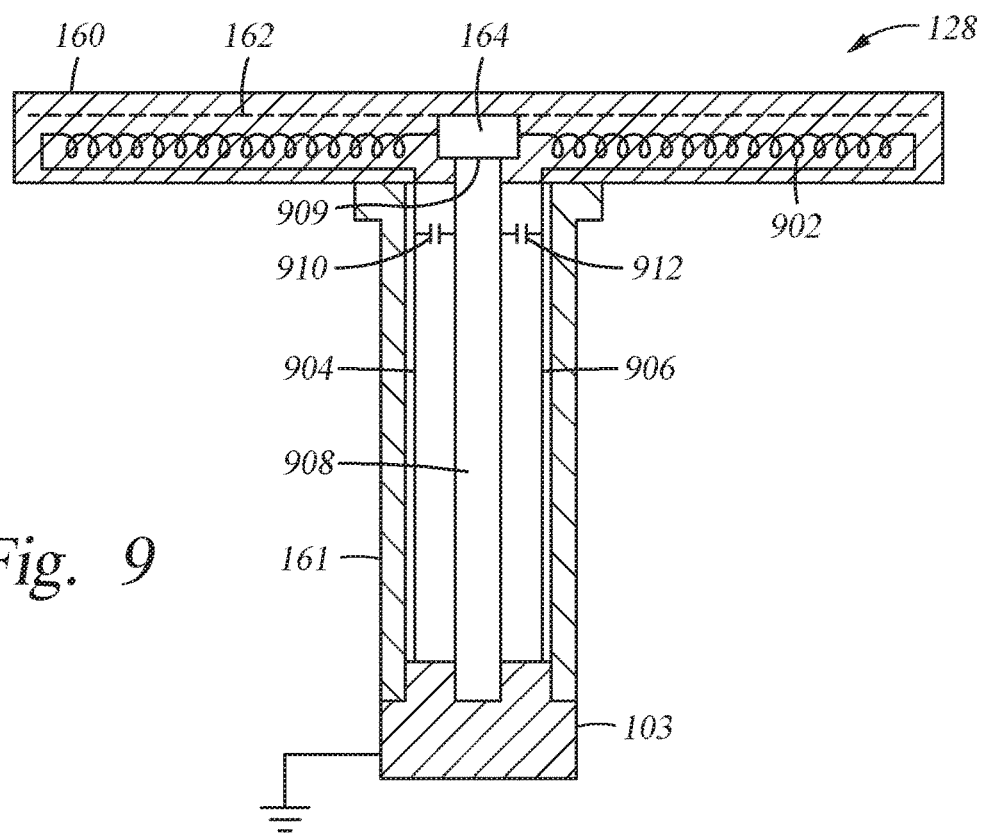
FIG. 9 illustrates a schematic cross-sectional view of a substrate support assembly disposed in the plasma processing chamber of FIG. 1 according to another embodiment described herein.

FIG. 9 illustrates a schematic cross-sectional view of the substrate support assembly 128 disposed in the plasma processing chamber 100 of FIG. 1 according to another embodiment described herein. As shown in FIG. 9, the substrate support assembly 128 includes the substrate support 160 and the stem 161. A heating element 902 may be embedded in the substrate support 160, and the heating element 902 is connected to the power box 103 via the connectors 904, 906. The connectors 904, 906 may be made of any electrically conductive metal for providing electrical power from the power box 103 to the heating element 902. The connectors 904, 906 are disposed within the stem 161. A rod 908 is disposed within the stem 161 connecting the stub 164 and the power box 103 for providing a path for an RF current. The rod may be made of Ni, Ti or of Ni coated with Au, Ag, Al or Cu. The rod 908 may include an end 909 connected to the stub 164, and a brazing material may be used to connect the end 909 of the rod 908 and the stub 164. The brazing material may be a metal alloy, such as Al or Au alloy. A capacitor 910 may be used to connect the connector 904 and the rod 908 to create an RF short, forming another path for the RF current to travel to the power box 103. A second capacitor 912 may be used to connect the connector 906 and the rod 908 to create another RF short, forming another path for the RF current to travel to the power box 103. The capacitors 910, 912 also serve as an open circuit to block the heating element current to the RF terminals. Since the RF current travels to the power box 103 via multiple paths, heat generated in the rod 908 is reduced.

Embodiments of the substrate support assembly described above may be combined. The substrate support assembly includes at least one rod made of Ti or of Ni coated with Au, Ag, Al or Cu in order to reduce heat generated in the rod as an RF current travels therethrough. Alternatively or in addition to, the rod may have a portion with a greater diameter than the diameter of the rest of the rod in order to reduce heat generated. Alternatively or in addition to, the length of the rod may be shortened or the number of rods may be increased in order to reduce heated generated.

While the foregoing is directed to embodiments of the present disclosure, other and further embodiments of the disclosure may be devised without departing from the basic scope thereof, and the scope thereof is determined by the claims that follow.

The invention claimed is:

1. A substrate support assembly, comprising:
    a substrate support;
    a stem connected to the substrate support;
    a radio frequency electrode embedded in the substrate support;
    a stub connected to the radio frequency electrode;
    a flexible cable;
    a first rod disposed within the stem, the first rod having a first end connected to the stub by a brazing material and a second end in contact with the flexible cable, wherein the first rod is made of titanium; and
    a second rod having a third end connected to the stub by a brazing material and a fourth end connected to the flexible cable.

2. The substrate support assembly of claim 1, wherein the first rod is a solid rod.

3. The substrate support assembly of claim 1, wherein the first rod is a hollow rod.

4. The substrate support assembly of claim 1, wherein the brazing material is an alloy.

5. The substrate support assembly of claim 1, further comprising:
    a heating element embedded in the substrate support;
    a first connector connected to the heating element; and
    a second connector connected to the heating element.

6. The substrate support assembly of claim 5, further comprising a first capacitor connecting the first connector and the first rod and a second capacitor connecting the second connector and the first rod.

7. A substrate support assembly, comprising:
    a substrate support;
    a stem extending from the substrate support in a first direction; and
    a rod extending from the substrate support in the first direction within the stem and comprising a first portion having a first diameter and a second portion having a second diameter, wherein
    the first and second portions are connected to each other in series in the first direction,
    the second diameter is greater than the first diameter, and
    the second portion has a lower resistance to radio frequency (RF) current than the first portion.

8. The substrate support assembly of claim 7, wherein the rod is a solid rod.

9. The substrate support assembly of claim 7, wherein the rod is a hollow rod.

10. The substrate support assembly of claim 7, wherein the rod is made of nickel, of titanium, or of nickel coated with gold, silver, aluminum, or copper.

11. The substrate support assembly of claim 7, wherein the rod further includes a third portion, wherein the third portion has a third diameter, and wherein the third diameter equals the first diameter.

12. A substrate support assembly, comprising:
a substrate support;
a stem extending from the substrate support in a first direction;
a radio frequency electrode embedded in the substrate support;
a connecting member disposed within the stem;
a first rod extending in the first direction within the stem, the first rod having a first end in direct contact with the radio frequency electrode and a second end in direct contact with the connecting member; and
a second rod extending in the first direction within the stem, the second rod having a third end in direct contact with the radio frequency electrode and a fourth end in direct contact with the connecting member,
wherein the second rod is disposed in parallel with the first rod in the first direction.

13. The substrate support assembly of claim 12, wherein the first and the second rods are made of nickel, of titanium, or of nickel coated with gold, silver, aluminum, or copper.

14. The substrate support assembly of claim 12, wherein the first and second rods are solid rods.

15. The substrate support assembly of claim 12, wherein the first and second rods are hollow rods.

* * * * *